United States Patent [19]

Takemoto

[11] Patent Number: 5,659,566
[45] Date of Patent: Aug. 19, 1997

[54] SEMICONDUCTOR LASER MODULE AND METHOD OF ASSEMBLING SEMICONDUCTOR LASER MODULE

[75] Inventor: Akira Takemoto, Itami, Japan

[73] Assignee: Mitsubishi Denki Kabushiki Kaisha, Tokyo, Japan

[21] Appl. No.: 321,774

[22] Filed: Oct. 12, 1994

[30] Foreign Application Priority Data

Oct. 13, 1993 [JP] Japan ................................. 5-255423

[51] Int. Cl.$^6$ ................................................ G02B 6/26
[52] U.S. Cl. ........................ 372/43; 385/14; 385/49; 385/92; 385/93
[58] Field of Search .......................... 385/14, 49, 92, 385/93; 372/43

[56] References Cited

U.S. PATENT DOCUMENTS

| | | | |
|---|---|---|---|
| 4,756,591 | 7/1988 | Fischer et al. | 385/92 |
| 4,818,053 | 4/1989 | Gordon et al. | 385/93 |
| 4,995,687 | 2/1991 | Nagai et al. | 350/96.2 |
| 5,039,191 | 8/1991 | Myszka | 385/49 |

FOREIGN PATENT DOCUMENTS

| | | |
|---|---|---|
| 0541386 | 5/1983 | European Pat. Off. . |
| 171615 | 7/1985 | European Pat. Off. . |
| 0280305 | 8/1988 | European Pat. Off. . |
| 2547661 | 12/1984 | France . |
| 3433717 | 9/1984 | Germany . |
| 61-87113 | 5/1986 | Japan .................................. 385/93 |
| 61-264778 | 11/1986 | Japan . |
| 3166786 | 7/1991 | Japan . |

*Primary Examiner*—Rodney B. Bovernick
*Assistant Examiner*—Yisun Song
*Attorney, Agent, or Firm*—Leydig, Voit & Mayer

[57] ABSTRACT

In a semiconductor laser module, a semiconductor laser element is disposed on a side surface of a submount perpendicular to a front surface of a pedestal. The semiconductor laser element, the submount, a lens, and an optical fiber are positioned on the front surface of the pedestal so that laser light emitted from the semiconductor laser element is applied through the lens to a prescribed portion of the optical fiber with high reliability. Positioning of the laser element in the direction perpendicular to the front surface of the pedestal is facilitated, and positioning accuracy is improved, resulting in a low-cost and high-performance semiconductor laser module.

9 Claims, 5 Drawing Sheets

SEMICONDUCTOR LASER MODULE AND METHOD OF ASSEMBLING SEMICONDUCTOR LASER MODULE

FIELD OF THE INVENTION

The present invention relates to a semiconductor laser module that facilitates positioning of a semiconductor laser element and improves positioning accuracy. The invention also relates to a method of assembling the semiconductor laser module.

BACKGROUND OF THE INVENTION

Figure 7:
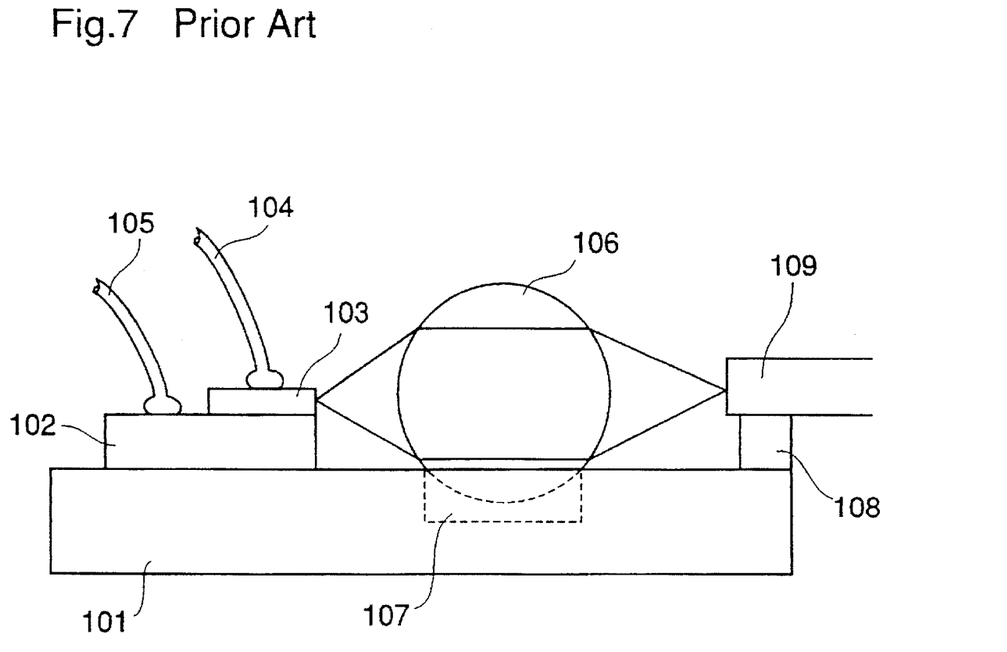
FIG. 7 is a side view of a semiconductor laser module according to the prior art.

FIG. 7 is a sectional view illustrating a prior art semiconductor laser module. In FIG. 7, reference numeral 101 designates a pedestal for supporting a semiconductor laser element and optical parts. The pedestal 101 comprises Si or the like and has a hole 107 about 100 μm deep. A submount 102 comprising SiC or the like and having a thickness of 300~500 μm is fixed on the pedestal 101. A semiconductor laser element 103 about 100 μm thick is disposed on the submount 102. Wires 104 and 105 are connected to the semiconductor laser element 103 and the submount 102, respectively, and current is supplied to the laser element through these wires. A spherical lens 106 having a radius of about 300 μm is set in the hole 107 of the pedestal 101. The spherical lens 106 is positioned by the hole 107. An optical fiber 109 is fixed on the pedestal 101 via a supporter 108 comprising SiC. The diameter of the optical fiber 109 is about 100 μm. The optical fiber includes a core through which light is transmitted. The diameter of the core is about 10 μm. The core is formed by doping a center portion of the optical fiber.

A description is given of the assembling process.

Initially, the hole 107 is formed in a prescribed position of the pedestal 101 by a conventional photolithographic technique, and the supporter 108 is formed on a prescribed part of the pedestal 101. The spherical lens 106 is set in the hole 107 and fixed using an adhesive or solder. The optical fiber 109 is fixed on the supporter 108 using an adhesive or solder. Thereafter, the submount 102 is fixed on a prescribed part of the pedestal 101 using a solder, such as Au-Sn, and a semiconductor laser element 103 is fixed on the submount 102 using a solder, such as Au-Sn. The positioning of the semiconductor laser element 103 is carried out using a marker disposed on a prescribed portion of the upper surface of the semiconductor laser element 103 opposite the laser light emitting point. Preferably, the marker is a metal film. Thereafter, the wires 104 and 105 are connected to the semiconductor laser element 103 and the submount 102, respectively, preferably by ultrasonic heating. The other ends of the wires 104 and 105 are connected to an external terminal of a voltage supply (not shown).

A description is given of the operation. When a voltage is applied across the wire 104 connected to an external terminal of the semiconductor laser element 103 and the wire 105 connected to the submount 105, current flows through the semiconductor laser element 103, and laser light is emitted from a light emitting point of the semiconductor laser element 103. The emitted laser light is collected by the lens 106 and applied to the center of the facet of the optical fiber 109, i.e., the core of the optical fiber 109.

In the present optical fiber communication, it is possible to transmit optical signals at a rate exceeding 2.5 G bit/sec by high-speed on-off switching of the voltage applied across the wires 104 and 105 to change the light intensity, i.e., by direct modulation.

In the prior art semiconductor laser module, in order to utilize the emitted laser light from the laser element 103 with high efficiency, the positions of the semiconductor laser element 103, the spherical lens 106, and the optical fiber 109 must be precisely determined so that the laser light emitted from the laser element 103 and collected by the spherical lens 109 is applied to the core of the optical fiber 109 with high reliability. Therefore, in the prior art laser module, the semiconductor laser element 103, the lens 106, and the optical fiber 109 are positioned on the pedestal 101 so that the light emitting point of the semiconductor laser element 103, the center of the lens 106, and the core of the optical fiber 109 are arranged in a straight line at prescribed intervals.

However, since the diameter of the core of the optical fiber 109, i.e., the effective diameter for transmitting laser light, is only 10 μm, if the precision of the assembly of the laser module is poor, it is difficult to apply the laser light emitted from the laser element 103 to the optical fiber 109. In the prior art semiconductor laser module, when the semiconductor laser element 103 is mounted on the submount 102, the position of the laser element 103 is observed from above so that the light emitting point of the semiconductor laser element 103 is disposed on a prescribed position of the pedestal 101, whereby the positioning accuracy of the semiconductor laser element 103 in the prescribed direction on the surface of the pedestal 101 is improved. However, the position of the light emitting point of the semiconductor laser element 103 in the direction perpendicular to the surface of the pedestal 101 depends on the thickness of the submount 102, the thickness of the solder connecting the submount 102 and the pedestal 101, the thickness of the semiconductor laser element 103, and the thickness of the solder connecting the submount 102 and the semiconductor laser element 103. Usually, in order to apply the emitted laser light to the core of the optical fiber 109 with high reliability, the positioning error of the light emitting point of the semiconductor laser element 103 in the direction perpendicular to the surface of the pedestal 101 must be lower than about 10 μm. However, since the total of the errors in the thickness of the submount 102, the thickness of the solder connecting the submount 102 and the pedestal 101, the thickness of the semiconductor laser element 103, and the thickness of the solder connecting the submount 102 and the semiconductor laser element 103 exceeds 10 μm, the positioning error of the light emitting point exceeds 10 μm. Because of the insufficient positioning precision, the laser light is not reliably applied to the core of the optical fiber 109, resulting in poor performance of the semiconductor laser and variations in the performances of each of a plurality of semiconductor laser modules.

Further, in this prior art laser module, since solder providing poor thickness controllability is present at two boundaries between the submount 102 and the pedestal 101 and between the submount 102 and the semiconductor laser element 103 in the direction perpendicular to the surface of the pedestal 101, the positioning precision of the light emitting point of the laser element cannot be improved.

Although it is possible to improve the processing precision of the thicknesses of the submount 102 and the semiconductor laser element 103 in order to solve the above-described problems, the improved processing precision is adverse to mass production, resulting in an increase in the production cost.

Meanwhile, there is another assembling method of the semiconductor laser module shown in FIG. 7. In this method, initially, the submount 102 with the semiconductor laser chip 103 is fixed on the pedestal 101 having the positioning hole 107 and the supporter 108, and the wires 104 and 105 are connected to the semiconductor laser element 103 and the submount 102, respectively, preferably by ultrasonic heating. Thereafter, the lens 106 is set in the hole 107 of the pedestal 101 and the optical fiber 109 is fixed on the supporter 108. In this assembling method, the intensity of light incident on the optical fiber 109 is measured while current flows through the wires 104 and 105, and the optical fiber 109 is fixed to the pedestal 101 when the intensity attains a maximum, whereby the laser light is sufficiently applied to the core of the optical fiber 109 without improving the processing precision of the submount 102 and the semiconductor laser element 103. As the result, a semiconductor laser module with sufficient performance is obtained. In this prior art method, however, the positioning of the optical fiber 109 takes about 10 minutes, so that the productivity is reduced and the cost of the assembly is increased, resulting in an expensive semiconductor laser module. In addition, since the laser light incident on the optical fiber 109 has a plurality of peaks because of scattering of the incident light, it is difficult to find a true peak of the emitted laser light.

SUMMARY OF THE INVENTION

It is an object of the present invention to provide a high-performance and low-cost semiconductor laser module that improves the positioning precision of the semiconductor laser element applying laser light to an optical fiber with high reliability.

It is another object of the present invention to provide a method of assembling the semiconductor laser module.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a semiconductor laser module, a semiconductor laser element is disposed on a side surface of a submount perpendicular to a front surface of a pedestal, and the submount with the semiconductor laser element, a lens, and an optical fiber are positioned on the front surface of the pedestal so that laser light emitted from the semiconductor laser element is applied through the lens to a prescribed portion of the optical fiber with high reliability. Therefore, the positioning of the laser element in the direction perpendicular to the front surface of the pedestal is facilitated, and the positioning accuracy is improved, resulting in a low-cost and high-performance semiconductor laser module.

According to a second aspect of the present invention, the semiconductor laser element has a step on the surface in contact with the side surface of the submount, and the submount has a step on the side surface in contact with the laser element. The step of the laser element is engaged with the step of the submount, whereby the laser element is positioned on the side surface of the submount. Therefore, the positioning of the laser element in the direction perpendicular to the front surface of the pedestal is facilitated.

According to a third aspect of the present invention, the pedestal has a projection in a prescribed position of the front surface. The semiconductor laser element is disposed on the pedestal so that a portion of the laser element is in contact with the projection. Therefore, the positioning of the semiconductor laser element in a prescribed direction on a plane parallel to the front surface of the pedestal is facilitated.

According to a fourth aspect of the present invention, a portion of the front surface and a portion of the resonator facet of the semiconductor laser element are in contact during production. Therefore, the semiconductor laser element is easily positioned on the front surface of the pedestal in the resonator length direction and in the direction perpendicular to the resonator length direction.

According to a fifth aspect of the present invention, the semiconductor laser element has a marker for positioning at the side surface that can be observed from the front surface of the pedestal. Therefore, the positioning of the semiconductor laser element in the direction parallel to the front surface of the pedestal is facilitated.

According to a sixth aspect of the present invention, a method of assembling a semiconductor laser module comprises fixing a lens and an optical fiber on a front surface of a pedestal, fixing a semiconductor laser element on a side surface of a submount, disposing the submount with the semiconductor element on the pedestal so that the side surface of the submount is perpendicular to the front surface of the pedestal, and positioning the submount on the front surface of the pedestal so that light emitted from the semiconductor laser element is applied through the lens to a prescribed portion of the optical fiber. Therefore, the positioning of the laser element in the direction perpendicular to the front surface of the pedestal is facilitated, and the positioning accuracy is improved, resulting in a low-cost and high-performance semiconductor laser module.

According to a seventh aspect of the present invention, the above-described assembling process further includes forming markers for position detection on a prescribed portion of the upper surface of the semiconductor laser element and on a prescribed portion on an edge of the side surface of the submount where the laser element is to be mounted, and fixing the semiconductor laser element on the submount so that the distance between the marker of the submount and the marker of the laser element on a plane perpendicular to the resonator length direction of the laser element and in the direction parallel to the side surface of the submount is equal to the height of the center of the lens from the front surface of the pedestal. Therefore, the positioning of the semiconductor laser element in the direction perpendicular to the front surface of the pedestal is facilitated.

According to an eighth aspect of the present invention, in the above-described assembling process, the semiconductor laser element is mounted on the submount using an optical positioning apparatus that detects the markers of the laser element and the submount and positions the laser element on the submount according to the positions of the markers. Therefore, the positioning of the semiconductor laser element in the direction perpendicular to the front surface of the pedestal is facilitated, and the positioning accuracy is improved.

DETAILED DESCRIPTION OF THE PREFERRED EMBODIMENTS

Figure 1:
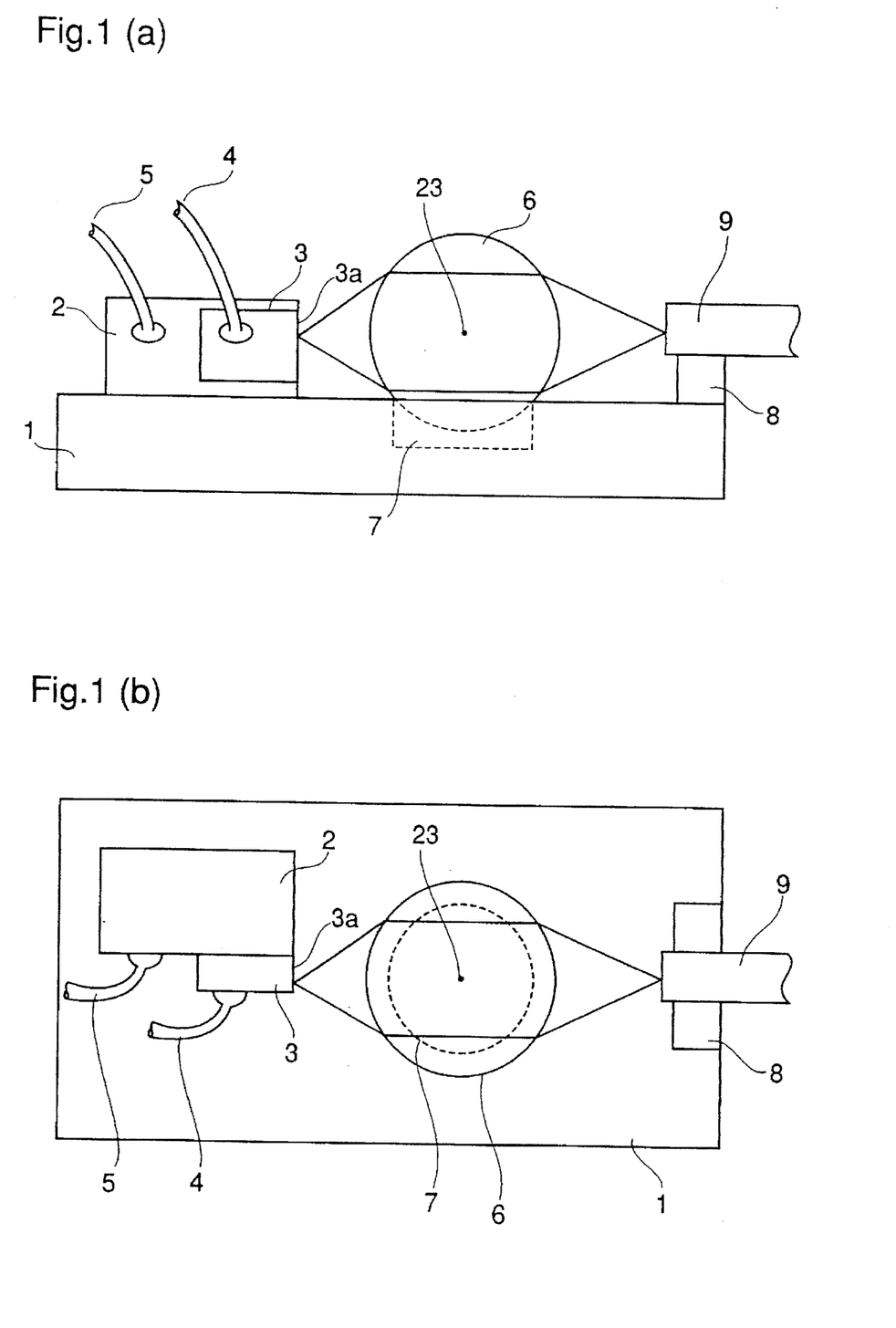
FIGS. 1(a) and 1(b) are a side view and a plan view illustrating a semiconductor laser module in accordance with a first embodiment of the present invention.

FIGS. 1(a) and 1(b) are a side view and a plan view illustrating a semiconductor laser module in accordance with a first embodiment of the present invention. In the figures, reference numeral 1 designates a pedestal supporting a semiconductor laser element and optical parts. The pedestal 1 comprises Si having a hole 7 at the front surface. An optical fiber 9 having a diameter of about 100 µm is fixed on the pedestal 1 via a supporter 8 comprising SiC. A lens 6 having a radius of about 300 µ is set in the hole 7 of the pedestal 1. Reference numeral 23 designates the center of the lens 6. The height of the supporter 8 and the depth of the hole 7 are selected so that the center 23 of the lens 6 is coplanar with the center of the facet of the optical fiber 9 from the front surface of the pedestal 1. A submount 2 comprising SiC is fixed on a prescribed portion of the front surface of the pedestal 1 so that the side surface of the submount 2 is perpendicular to the front surface of the pedestal 1 and parallel to the optical axis of the optical fiber 9. The height of the submount 2 from the front surface of the pedestal 1 is about 450 µm, and the length of the submount 2 in the direction perpendicular to the optical axis of the fiber 9 is 300~500 µm. A semiconductor laser element 3 comprising InGaAsP and emitting light having a wavelength of 1.3 µm is disposed on the side surface of the submount 2. The semiconductor laser element 3 has a length of 300 µm in the resonator length direction, a width of about 300 µm in the resonator width direction, and a thickness of about 100 µm. The laser light emitting facet 3a of the semiconductor laser element 3 is in the same plane with a side surface of the submount 2 perpendicular to the optical axis of the optical fiber 9. The laser light emitting facet 3a and the facet of the optical fiber 9 are opposed to each other through the lens 6, with a prescribed interval between them. Wires 4 and 5 are connected to the upper surface of the laser element 3 and the side surface of the submount 2 where the laser element 3 is present, respectively, and current is supplied to the laser element 3 through the wires 4 and 5.

The assembling process of the semiconductor laser module according to the first embodiment of the invention is illustrated in FIGS. 2(a)–2(d). In the figures, the same reference numerals as in FIGS. 1(a)–1(b) designate the same or corresponding parts. Reference numeral 30 designates a light emitting point of the semiconductor laser element 3. Reference numeral 20 designates a first reference point disposed at an end of a surface of the submount 2 where the laser element 3 is disposed. When the submount 2 is mounted on the pedestal 1, the first reference point 20 is opposed to the optical fiber 9 and in contact with the surface of the pedestal 1. Reference numeral 21 designates a second reference point disposed on the upper surface of the semiconductor laser element 3, indicating a position just above the light emitting point 30. Markers which can be confirmed visually or with a detector are disposed on the first and second reference points 20 and 21. Reference numeral 22 designates a third reference point disposed on a side surface of the laser element 3 indicating a position just beside the light emitting point 30 of the laser element 3.

Initially, the hole 7 for determining the position of the lens 6 is formed on the front surface of the pedestal 1 by conventional photolithographic techniques. Thereafter, using adhesive or the like, the supporter 8 is fixed on the front surface of the pedestal 1, the lens 6 is set in the hole 7 of the pedestal 1, and the optical fiber 9 is fixed on the supporter 8.

Figure 2:
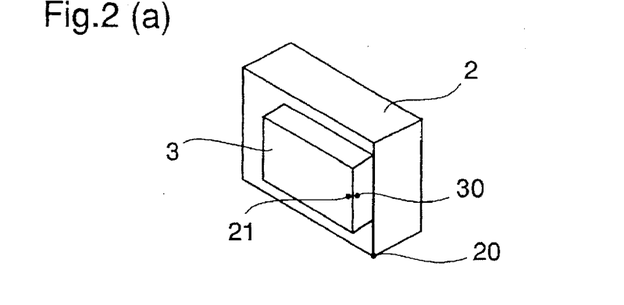
FIGS. 2(a)–2(d) are diagrams for explaining an assembling method of the semiconductor laser module according to the first embodiment of the present invention.

As illustrated in FIG. 2(a), the positions of the first reference point 20 of the submount 2 and the second reference point 21 of the laser element 3 are detected with a microscope and adjusted so that the distance between the first and second reference points, i.e., the height of the reference point 21 from the bottom of the submount 2, is equal to the height of the center 23 of the lens 6 and to the height of the center of the facet of the optical fiber 9. After the positioning, the laser element 3 is fixed on the submount 2 using solder. The laser emitting facet of the semiconductor laser element 3 should be in the same plane with the side surface of the submount 2 facing the lens 6. Thereafter, as illustrated in FIG. 2(d), the position of the submount 2 on the pedestal 1 is determined so that the upper surface of the semiconductor laser element 3 is perpendicular to the surface of the pedestal 1, the laser emitting facet of the laser element 3 is opposed to the facet of the optical fiber 9 through the lens 6, and the third reference point 22 indicating the position of the light emitting point 30 of the laser element 3 is on a straight line with the center 23 of the lens 6 fixed on the pedestal 1 and the center of the facet of the optical fiber 9. After the positioning, the submount 2 is fixed on the pedestal 1 using solder.

Thereafter, the wires 4 and 5 are connected to the semiconductor laser element 3 and the submount 2, respectively, preferably by ultrasonic heating, completing the semiconductor laser module shown in FIGS. 1(a)–1(b). The semiconductor laser module is sealed in a plastic package or a ceramic package.

In this first embodiment of the present invention, since the semiconductor laser element 3 is disposed on the side surface of the submount 2 so that the upper surface of the laser element 3 is perpendicular to the surface of the pedestal 1, the position of the laser element 3 on the submount 2 is variable in the direction perpendicular to the surface of the pedestal 1 to adjust the height of the light emitting point 30 of the laser element 3. In the prior art semiconductor laser module, the height of the light emitting point of the laser element 103 depends on the thicknesses of the laser element 103, the submount 102, and the solder, and these thicknesses cannot be easily controlled during or after fabrication, resulting in difficulty in positioning the light emitting point of the laser element 103 in the direction perpendicular to the surface of the pedestal 101. On the other hand, in this first embodiment of the invention, it is possible to accurately position the light emitting point 30 of the laser element 3 in the direction perpendicular to the surface of the pedestal 1 by adjusting the position of the laser element 3 on the side surface of the submount 2. Therefore, the laser light emitted from the light emitting point 30 of the laser element 3 is applied to the optical fiber 9 through the lens 6 with high reliability, resulting in a high-performance semiconductor laser module.

Further, in the direction perpendicular to the surface of the pedestal 1, the solder is present only between the pedestal 1 and the submount 2. Therefore, the error in the positioning precision of the laser light emitting point 30 in the direction perpendicular to the surface of the pedestal 1 caused by the solder having a poor thickness controllability is reduced.

Furthermore, the positioning of the laser light emitting point 30 in the direction parallel to the surface of the pedestal 1 is carried out in the same way as in the prior art laser module. That is, the position of the submount 2 with the laser element 3 on the surface of the pedestal 1 is adjusted using the third reference point 22 so that the laser light emitting point 30 has a prescribed position.

Figure 3:
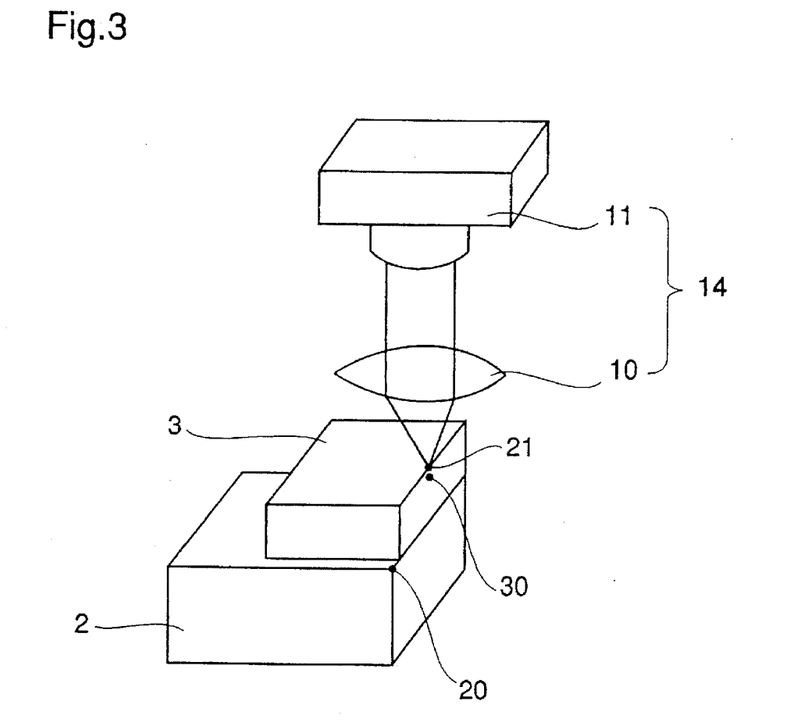
FIG. 3 is a perspective view for explaining an assembling method of a semiconductor laser module in accordance with a second embodiment of the present invention.

FIG. 3 is a perspective view for explaining a process of positioning a semiconductor laser element on a submount, according to a second embodiment of the present invention. In the figure, the same reference numerals as in FIGS. 2(a)–2(d) designate the same or corresponding parts. Reference numeral 10 designates a magnifying lens. Reference numeral 11 designates a television camera connected through a computer (not shown) to an apparatus for mounting the semiconductor laser element 3 on the submount 2 (not shown). The lens 10 and the television camera 11 make an optical positioning apparatus 14, i.e., a vision system. In the above-described first embodiment of the invention, when the semiconductor laser element 3 is mounted on the submount 2, the position of the laser element 3 on the submount 2 is adjusted manually or by using a mounting apparatus while observing the positions of the reference point 21 of the laser element 3 and the reference point 20 of the submount 2 with a microscope or the like. On the other hand, in this second embodiment of the invention, the positioning of these reference points 21 and 20 is performed with the optical positioning apparatus 14 comprising the magnifying lens 10 and the television camera 11.

A description is given of the positioning process using the optical positioning apparatus 14.

Initially, markers comprising metal films or the like that are detectable by the television camera 11 are formed on the first reference point 20 of the submount 2 and on the second reference point 21 of the laser element 3. The positions of the reference points 20 and 21 are detected through the lens 10 by the television camera 11, and the obtained data is sent to the computer. In the computer, the data is analyzed a software. According to the result of the analysis, the laser element mounting apparatus (not shown) is driven so that the reference point 21 of the laser element 3 is located in a prescribed position relative to the reference point 20 of the submount 2. More specifically, the detection and the analysis are repeated until the distance between the first and second reference points 20 and 21, i.e., the height of the reference point 21 from the bottom of the submount 2, is equal to the height of the center 23 of the lens 6 and to the height of the center of the facet of the optical fiber 9. In this way, the light emitting point 30 of the laser element 3 is accurately positioned in the direction perpendicular to the surface of the pedestal 1.

As described above, in this second embodiment of the present invention, the positioning of the semiconductor laser element 3 on the submount 2 is automatically controlled with high accuracy by the optical positioning apparatus 14 comprising the magnifying lens 10 and the television camera 11, whereby a high-performance semiconductor laser module is easily fabricated.

Figure 4:
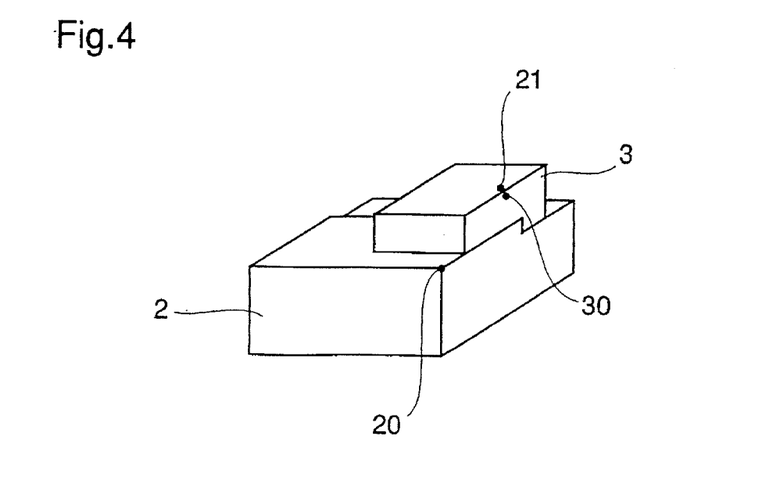
FIG. 4 is a perspective view for explaining an assembling method of a semiconductor laser module in accordance with a third embodiment of the present invention.

FIG. 4 is a perspective view of a part of a semiconductor laser module in accordance with a third embodiment of the present invention. In the figure, a semiconductor laser element 3 is mounted on a submount 2. The semiconductor laser element 3 has a step on the rear surface in contact with the submount 2. The step extends in the resonator length direction of the laser element 3. The submount 2 has a step engaging the step of the laser element 3 on the surface in contact with the laser element 3. These steps are formed by a conventional photolithographic technique so that the light emitting point 30 of the laser element 3 is disposed in a prescribed position in the direction perpendicular to the surface of the pedestal 1 when the laser element 3 is mounted on the submount 1 with the steps engaged. Therefore, the optical detection of the reference points 20 and 21 as in the above-described first and second embodiments is dispensed with.

In this third embodiment of the invention, since the positioning of the semiconductor laser element 3 in the direction perpendicular to the surface of the pedestal 1 is performed by engaging the step of the laser element 3 with the step of the submount 2, the optical detection of the position of the laser element 3 is dispensed with, whereby the positioning process is simplified. In addition, the precision of the height of the laser light emitting point 30 from the surface of the pedestal 1 depends on the processing precision of the steps. Since the steps are formed by a photolithographic technique providing a high processing precision, the positioning of the laser light emitting point 30 is performed with high accuracy. As the result, a semiconductor laser module with improved characteristics is achieved.

Figure 5:
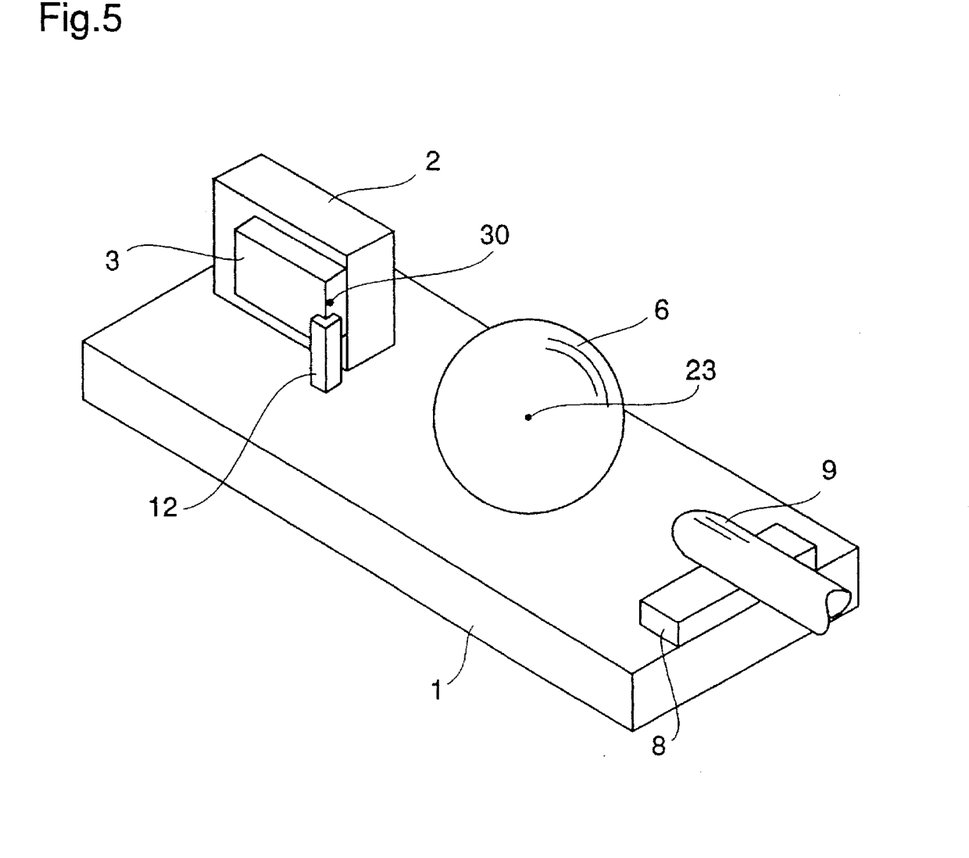
FIG. 5 is a perspective view for explaining an assembling method of a semiconductor laser module in accordance with a fourth embodiment of the present invention.

FIG. 5 is a perspective view illustrating a semiconductor laser module in accordance with a fourth embodiment of the present invention. In FIG. 5, the same reference numerals as in FIGS. 1(a)–1(b) designate the same or corresponding parts. Reference numeral 12 designates a projection disposed on the front surface of the pedestal 1 for positioning a semiconductor laser element. This projection 12 is formed by a conventional photolithographic technique. The height of the projection 12 reaches the semiconductor laser element 3 disposed on the side surface of the submount 2 but does not reach the light emitting point 30. The projection 12 has a groove engaged with a part of the corner of the laser element 3 between the upper surface and the light emitting facet. When the laser element 3 is engaged with the groove of the projection 12, the laser element 3 is positioned on a prescribed part of the front surface of the pedestal 1 so that the light emitting point 30 of the laser element 3 is aligned with the center 23 of the lens 6 and the center of the facet of the optical fiber 9. Also in this fourth embodiment, since the optical means for detecting the reference points is dispensed with, the positioning of the submount 2 is facilitated.

Further, since the photolithographic technique provides a high processing precision, the projection 12 is formed on a prescribed part of the pedestal with high precision, resulting in a highly-precise positioning of the light emitting point 30 of the laser element 3. As the result, a semiconductor laser module with improved characteristics is achieved.

Figure 6:
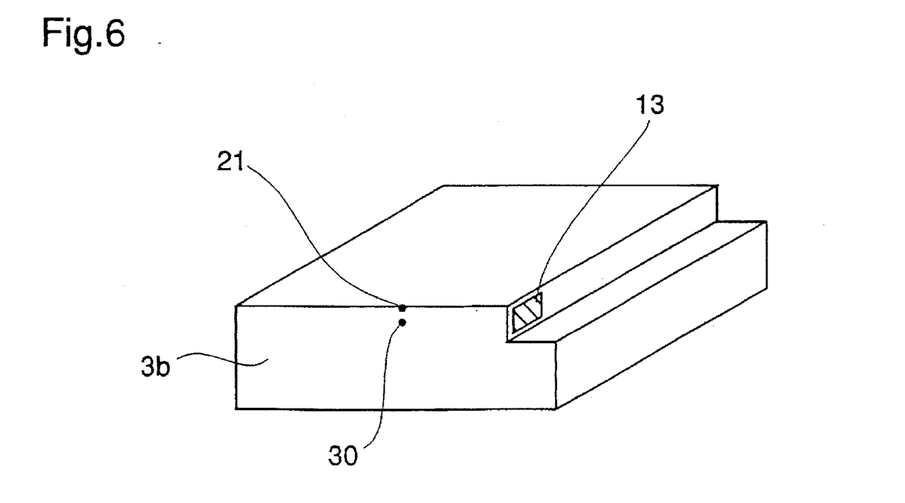
FIG. 6 is a perspective view illustrating a semiconductor laser element included in a semiconductor laser module in accordance with a fifth embodiment of the present invention.

FIG. 6 is a perspective view illustrating a semiconductor laser element included in a semiconductor laser module in accordance with a fifth embodiment of the present invention. In the figure, a semiconductor laser element 3 has a marker 13 for position detection. Preferably, the marker 13 comprises a metal film.

The process of forming the marker 13 on the semiconductor laser element 3a will be described.

Initially, a plurality of semiconductor laser elements are formed on a semiconductor substrate (not shown).

Thereafter, a groove is formed on a prescribed surface of the substrate, preferably by etching. The surface of the substrate with the groove will be a side surface of each semiconductor laser element that is observable when the laser element is disposed on a pedestal. Thereafter, a plurality of markers 13 are formed on portions of the groove opposite the light emitting points of the respective laser elements, followed by cleaving to produce a semiconductor laser chip 13a shown in FIG. 6.

In this fifth embodiment of the present invention, the positioning of the semiconductor laser element 3a in the direction parallel to the surface of the pedestal 1 is performed using the marker 13 formed on the side surface of the laser element 3a. In the above-described first embodiment, it is sometimes difficult to detect the position of the reference point 22 using the optical means because the reference point 22 is on a semiconductor crystal plane that is not always flat. On the other hand, in this fifth embodiment, since the marker 13 is employed in place of the reference point 22, the detection of the light emitting point is facilitated. As the result, the positioning of the semiconductor laser element is performed with high accuracy.

Figure 8:
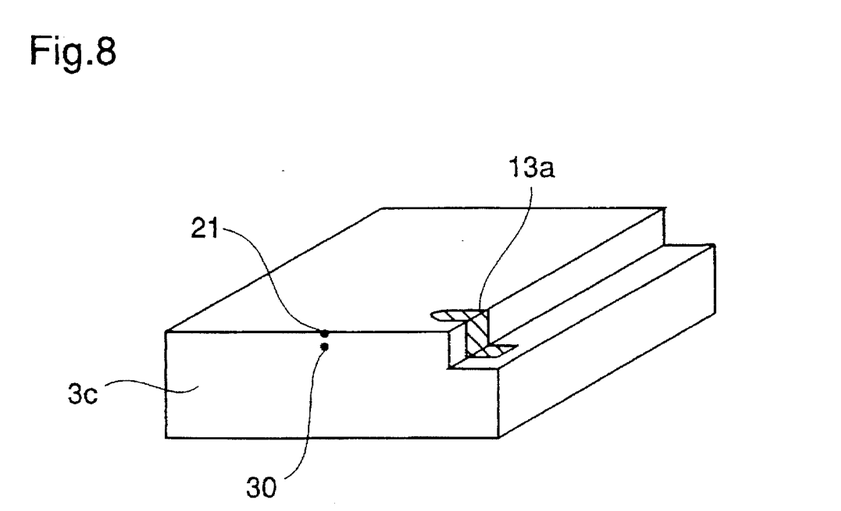
FIG. 8 is a perspective view illustrating a semiconductor laser element according to a variation of the fifth embodiment of the present invention.

Since the marker 13 is disposed only for indicating the position of the laser light emitting point on the side surface of the laser element, it may be a part 13a of a metal electrode formed on the upper surface of the semiconductor laser element 3b as shown in FIG. 8.

While in the above-described first to fifth embodiments the semiconductor laser module comprises the Si pedestal, a SiC submount, an InGaAsP laser element, and an SiC supporter, other materials may be used as these constituents of the semiconductor laser module with the same effects as described above.

What is claimed is:

1. A semiconductor laser module comprising:

a pedestal having opposite first and second surfaces;

a submount disposed on a part of the first surface of the pedestal and having a side surface perpendicular to the first surface of the pedestal;

a semiconductor laser element disposed on the side surface of the submount and spaced from the first surface of the pedestal whereby spacing between the first surface of the pedestal and the semiconductor laser element may be selectively determined and wherein the semiconductor laser element has a first step on a surface in contact with the side surface of the submount, the submount has a second step on the side surface in contact with the semiconductor laser element, and the semiconductor laser element is positioned on the side surface of the submount at a fixed height from the first surface of the pedestal with the first step of the semiconductor laser element engaging the second step of the submount;

a lens disposed on the first surface of the pedestal; and an optical fiber having an optical axis, disposed on the first surface of the pedestal, and having a light incident facet transverse to the optical axis wherein the side surface of the submount is parallel to the optical axis, the semiconductor laser element is positioned on the submount, and the submount, the lens, and the optical fiber are positioned relative to the optical axis so that light emitted from the semiconductor laser element is applied through the lens to a central region of the light incident facet of the optical fiber.

2. The semiconductor laser module of claim 1 wherein the semiconductor laser element includes a marker for positioning on a side surface that can be observed from above the first surface of the pedestal.

3. A semiconductor laser module comprising:

a pedestal having opposite first and second surfaces;

a submount disposed on a part of the first surface of the pedestal and having a side surface perpendicular to the first surface of the pedestal;

a semiconductor laser element disposed on the the surface of the submount and spaced from the first surface of the pedestal whereby spacing between the first surface of the pedestal and the semiconductor laser element may be selectively determined and wherein the pedestal includes a projection on a part of the first surface, the projection having a height and reaching the semiconductor laser element disposed on the submount, and the semiconductor laser element is positioned in a direction parallel to the first surface of the pedestal with the semiconductor laser element abutting the projection;

a lens disposed on the first surface of the pedestal; and an optical fiber having an optical axis, disposed on the first surface of the pedestal, and having a light incident facet transverse to the optical axis wherein the side surface of the submount is parallel to the optical axis, the semiconductor laser element is positioned on the submount, and the submount, the lens, and the optical fiber are positioned relative to the optical axis so that light emitted from the semiconductor laser element is applied through the lens to a central region of the light incident facet of the optical fiber.

4. The semiconductor laser module of claim 3 wherein the semiconductor laser element is positioned with a resonator length direction of the semiconductor laser element perpendicular to the projection by abutting the semiconductor laser element with the projection.

5. A method of fabricating a semiconductor laser module comprising:

preparing a pedestal having opposite first and second surfaces;

fixing a lens on a part of the first surface of the pedestal;

fixing an optical fiber having an optical axis and a light incident facet transverse to the optical axis on a part of the first surface of the pedestal so that the light incident facet is opposed to the lens;

preparing a submount having a side surface and including a second step, and a semiconductor laser element having opposite front and rear surfaces a first step on the rear surface, and a light emitting point;

fixing the semiconductor laser element on the side surface of the submount with the rear surface of the semiconductor laser element in contact with the side surface of the submount by engaging the first step of the laser element with the second step of the submount; and putting the submount on the first surface of the pedestal so that the side surface having the semiconductor laser element is perpendicular to the first surface of the pedestal and parallel to the optical axis, and fixing the submount on a part of the first surface of the pedestal so that the semiconductor laser element is spaced from the first surface of the pedestal and the light emitted from the semiconductor laser element is applied through the lens to a central region of the light incident facet of the optical fiber.

6. The method of claim 5 including:

forming a first marker indicating the position of the light emitting point of the semiconductor laser element on a portion of the front surface of the semiconductor laser element, and forming a second marker on a portion of an edge of the side surface of the submount where the semiconductor laser element is to be disposed, the second marker contacting the first surface of the pedestal when the submount is mounted on the pedestal; and mounting the semiconductor laser element on the submount so that the distance between the first marker of the semiconductor laser element and the second marker of the submount in a direction perpendicular to a resonator length direction of the laser element is equal to a distance from the center of the lens to the first surface of the pedestal.

7. The method of claim 6 including:

using an optical positioning apparatus, detecting the first marker of the semiconductor laser element and the second marker of the submount and thereby determining the position of the semiconductor laser element on the submount.

8. The method of claim 5 including:

forming a marker for position detection on a side surface of the semiconductor laser element that can be observed from above the first surface of the pedestal; and mounting the submount with the semiconductor laser element on the first surface of the pedestal so that the marker of the semiconductor laser element is located at a desired position.

9. A method of fabricating a semiconductor laser module comprising:

preparing a pedestal having opposite first and second surfaces;

fixing a lens on a part of the first surface of the pedestal;

fixing an optical fiber having an optical axis and a light incident facet transverse to the optical axis on a part of the first surface of the pedestal so that the light incident facet is opposed to the lens;

preparing a submount having a side surface, and a semiconductor laser element having opposite front and rear surfaces and a light emitting point;

fixing the semiconductor laser element on the side surface of the submount with the rear surface of the semiconductor laser element in contact with the side surface of the submount;

forming a projection on part of the first surface of the pedestal;

positioning the submount with the semiconductor laser element on the first surface of the pedestal so that the side surface having the semiconductor laser element is perpendicular to the first surface of the pedestal and parallel to the optical axis, by abutting a part of the semiconductor laser element and the projection, the projection having a height reaching the semiconductor laser element; and fixing the submount on a part of the first surface of the pedestal so that the semiconductor laser element is spaced from the first surface of the pedestal and the light emitted from the semiconductor laser element is applied through the lens to a central region of the light incident facet of the optical fiber.

* * * * *

UNITED STATES PATENT AND TRADEMARK OFFICE
CERTIFICATE OF CORRECTION

PATENT NO. : 5,659,566
DATED : August 19, 1997
INVENTOR(S) : Takemoto

It is certified that error appears in the above-indentified patent and that said Letters Patent is hereby corrected as shown below:

Item 56, (Foreign Patent Documents) Line 1, change "5/1983" to --5/1993--; (Column 2)

Column 10, Line 8, change "the" to --side--; (2nd Occur.)

Line 46, after "surfaces" insert --,--.

Signed and Sealed this

Thirtieth Day of December, 1997

Attest:

BRUCE LEHMAN

Attesting Officer

Commissioner of Patents and Trademarks